(12) United States Patent
Chen et al.

(10) Patent No.: US 7,872,930 B2
(45) Date of Patent: Jan. 18, 2011

(54) TESTING A MEMORY DEVICE HAVING FIELD EFFECT TRANSISTORS SUBJECT TO THRESHOLD VOLTAGE SHIFTS CAUSED BY BIAS TEMPERATURE INSTABILITY

(75) Inventors: Nan Chen, San Diego, CA (US);
Sian-Yee Sean Lee, Vista, CA (US);
Seong-Ook Jung, Goyang-Si (KR);
Zhongze Wang, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 108 days.

(21) Appl. No.: 12/121,560

(22) Filed: May 15, 2008

(65) Prior Publication Data
US 2009/0285044 A1 Nov. 19, 2009

(51) Int. Cl.
*G11C 29/00* (2006.01)
(52) U.S. Cl. .................. 365/201; 365/154; 365/189.07
(58) Field of Classification Search ................. 714/721; 365/185.02
See application file for complete search history.

(56) References Cited

U.S. PATENT DOCUMENTS

| | | | |
|---|---|---|---|
| 4,901,284 A | | 2/1990 | Ochii et al. |
| 5,034,923 A | * | 7/1991 | Kuo et al. ............... 365/189.16 |
| 5,463,585 A | * | 10/1995 | Sanada ........................ 365/201 |
| 6,590,818 B1 | | 7/2003 | Liston et al. |
| 7,009,905 B2 | | 3/2006 | Aipperspach et al. |
| 7,075,838 B2 | | 7/2006 | Jeung et al. |
| 7,286,382 B1 | * | 10/2007 | Vadi et al. ............... 365/189.15 |
| 7,450,452 B2 | * | 11/2008 | Rosal et al. .................. 365/201 |

FOREIGN PATENT DOCUMENTS

EP 0947994 10/1999

OTHER PUBLICATIONS

International Search Report-PCT/US09/044171, International Search Authority-European Patent Offices-Aug. 5, 2009.
Written Opinion-PCT/US09/044171, International Search Authority-European Patent Office-Aug. 5, 2009.

* cited by examiner

*Primary Examiner*—Tan T. Nguyen
(74) *Attorney, Agent, or Firm*—Donald Kordich; William M. Hooks (57) ABSTRACT

A supply voltage is set for a memory device at a first supply voltage level. Test data is written to the memory device at the first supply voltage level in response to setting the supply voltage. The supply voltage is decreased for the memory device to a second supply voltage level below the first supply voltage level in response to writing the test data. The test data is read from the memory device at the second supply voltage level in response to decreasing the supply voltage. The supply voltage is increased for the memory device to a third supply voltage level above the second supply voltage level in response to reading the test data. The test data is read from the memory device at the third supply voltage level in response to increasing the supply voltage. The test data written to the memory device at the first supply voltage level is compared to the test data read from the memory device at the third supply voltage level in response to reading the test data from the memory device at the third supply voltage level.

23 Claims, 4 Drawing Sheets

FIG. 1

100
Static Random Access Memory (SRAM) Cell

--Prior Art--

TESTING A MEMORY DEVICE HAVING FIELD EFFECT TRANSISTORS SUBJECT TO THRESHOLD VOLTAGE SHIFTS CAUSED BY BIAS TEMPERATURE INSTABILITY

FIELD OF THE INVENTION

The present invention generally relates to field effect transistor (FET) circuits. More specifically, the present invention relates to testing a memory device having field effect transistors (FET) subject to threshold voltage ($V_T$) shifts caused by bias temperature instability (BTI).

BACKGROUND OF THE INVENTION

Modern electronic devices and systems, for example, computer processors, mobile telephones, personal digital assistants (PDAs), digital cameras, and combinations thereof currently rely on logic (e.g., controller) and storage (e.g., memory) circuits fabricated with semiconductor materials to form integrated circuits called chips.

Random access memory (RAM) is an example of a common storage circuit that permits data to be accessed in any order (e.g., randomly), regardless of the data's physical location in the memory chip and regardless of whether or not the data is related to previous data. Two types of RAM include Static RAM (SRAM), which typically does not need to be refreshed, and Dynamic RAM (DRAM), which typically needs to be refreshed. SRAM is usually faster, but more expensive than DRAM. Both SRAM and DRAM are typically volatile in the sense that they lose data when power is removed from the memory chip.

Complementary Metal Oxide Semiconductor (CMOS) technology is widely used in such logic and storage circuitry because they provide relatively high speed and relatively low power. CMOS circuits employ P-channel field effect transistors (PFETs) and N-channel field effect transistors (NFETs).

Recent advances in CMOS fabrication technology have reduced the physical sizes of the FETs. FET supply voltages ($V_{DD}$) have been reduced to save power and to accommodate requirements of the reduction in the physical sizes of the FETs. FET threshold voltages ($V_T$) have been reduced to mitigate performance degradation effects of reduced FET gate voltages resulting from the reduction of supply voltages.

Due to the reduced physical sizes and the reduction in threshold voltages ($V_T$) of the FETs, threshold voltage ($V_T$) shifts in PFETs caused by negative bias temperature instability (NBTI) are becoming a significant reliability issue. NBTI reduces transistor performance parameters (e.g., drain current, transconductance, threshold voltage ($V_T$), capacitance, etc.).

The threshold voltage ($V_T$) shifts in PFETs caused by NBTI causes an increase in the absolute value of the threshold voltage ($V_T$) in a PFET. The increase in the threshold voltage ($V_T$) in a PFET is a function of the gate voltage relative to the source and drain voltages on the PFET. The threshold voltage ($V_T$) shifts in PFETs caused by NBTI accumulate over time during which the PFET is in a voltage stress condition, which is a condition known as aging.

A PFET is in an NBTI voltage stress condition when the source and the drain of the PFET are both at a logic "high" voltage level and the gate is at a logic "low" voltage level, such as when a PFET is biased in an inversion state (e.g., $V_S = V_D = V_B = V_{DD}$ and $V_G = 0$). For example, in a CMOS chip, employing current technology, having a 1.2 volt supply voltage, a PFET is in an NBTI voltage stress condition when its source and its drain are at 1.2 volt and its gate is at ground (i.e. 0 volts). When the gate is logic "high" and the source is logic "high," the PFET tends to recover somewhat from NBTI caused $V_T$ increase. A balanced duty cycle for PFETs (50% in an NBTI voltage stress condition, 50% not in an NBTI voltage stress condition) would produce varying stress on the PFET. A full duty cycle for PFETs (100% in an NBTI voltage stress condition) would produce maximum stress on the PFET. A minimum or no duty cycle for PFETs (100% not in an NBTI voltage stress condition) would produce little or no stress on the PFET.

Several methods attempt to address the problem associated with the threshold voltage ($V_T$) shifts in PFETs caused by NBTI. Some methods use CMOS fabrication process techniques to minimize the amount of threshold voltage ($V_T$) shift that occurs to minimize the number of defective chips. Other methods screen the chips after the CMOS fabrication process to separate the chips with defects from chips without defects.

Present CMOS fabrication process techniques employ a thinner dielectric material, such as oxides, used for the gate terminal of the PFET. However, thinning dielectric material has made the threshold voltage ($V_T$) shifts in PFETs caused by NBTI more significant as an overall percentage of the normal threshold voltage ($V_T$) variability. Environmental conditions such as high temperature also encourage threshold voltage ($V_T$) shifts in PFETs caused by NBTI.

In current CMOS fabrication designs (e.g., 65 nm node), typical threshold voltage ($V_T$) shift caused by NBTI may be 30 to 40 mV (millivolts) for a 50% duty cycle (i.e., the PFET spends half of the time in an NBTI voltage stress condition and half of its time not in an NBTI voltage stress condition) of the PFET. However, the threshold voltage ($V_T$) shift in PFETs caused by NBTI may be 80 to 90 mV if the duty cycle is close to 100% (i.e., the PFET is almost always in an NBTI voltage stress condition). If an almost 0% duty cycle exists (i.e., the PFET is almost never in an NBTI voltage stress condition), virtually no threshold voltage ($V_T$) shift in PFETs caused by NBTI occurs.

A number of situations can cause the duty cycle of a particular PFET to be significantly higher than 50%, of which one example is SRAM. For example, during normal operation of an electronic system, some storage elements, such as SRAM, may be written into and seldom if ever change, causing some of the PFETs to remain almost constantly in a voltage condition that causes threshold voltage ($V_T$) shifts in PFETs caused by NBTI to accumulate. For example, operating system code is copied from nonvolatile storage such as a disk into an on-chip storage element, such as a memory array, in an electronic system, such as a computer, and is normally never changed for the entire time the computer is operating. Furthermore, it is likely that the operating system code is stored into the same locations in the storage element each time the computer is restarted. Therefore, threshold voltage ($V_T$) shift in PFETs caused by NBTI is a significant threat to SRAM reliability.

NBTI also causes what might have been marginal, but operative, memory storage locations to become failing storage locations, such as degrading the READ stability of SRAM. For example, in a memory array (e.g., SRAM, or DRAM), an array built in self-test (ABIST) controller is commonly applied during testing of the chip.

An array built in self-test (ABIST) controller may be used during burn-in stress conditions (e.g., elevated temperature and/or supply voltage), such as a high temperature operating life (HTOL) test, to identify defects in a chip, such as a memory array (e.g., SRAM, or DRAM). The increased temperature and supply voltage conditions applied during burn-in increases the rate of degradation due to threshold voltage ($V_T$) shifts in PFETs caused by NBTI. During burn-in, the ABIST controller generates data patterns that are sent to the memory array. ABIST checks output data patterns from the memory array against data pattern results expected from a memory array having no defect. Applying the generated data patterns to the memory array stresses the memory array, looking for defect types with various disturb data patterns. Some sets of ABIST data patterns result in a duty cycle near 100% for at least some PFETs in the memory array. Some electronic systems also run ABIST during restarts of the electronic systems. Restarts occur when the electronic system is powered up. Restarts on electronic systems also may be caused by manual intervention.

There are two conventional methods to screen the chips after the CMOS fabrication process to separate the chips with defects from chips without defects. A first screen method is a stress test or burn-in test, mentioned above, which stress the memory at a higher supply voltage Vdd and/or a higher temperature over time, which may be many hours. After the stress test, the chips are typically tested for functionality under a nominal supply voltage and temperatures. One disadvantage is the long time for completing the test.

A second screen method is a low voltage test, which tests the functionality of the chips below a design-specified minimum voltage. In the low voltage test, a data pattern is written to the chip at a voltage level below the design-specified minimum voltage. Then, the data pattern is read from the chip at the voltage level below the design-specified minimum voltage (i.e., a guard-band voltage gap). The data patterns written and read at the voltage level below the design-specified minimum voltage are compared to determine if the chip passes or fails the screen. An advantage of this method is that the method is much faster than the stress method. However, a disadvantage of this method is that the data patterns are written and read at the voltage level below the design-specified minimum voltage where the chip was not designed to function. Hence, this method causes more good parts to be screen out than otherwise should be screen out due to sensing margin and/or timing issues in the chip.

A similar voltage threshold ($V_T$) shift in NFETs exists, although to a lesser degree than in PFETs in current technology, and is called positive bias temperature instability (PBTI). A NFET is in a PBTI voltage stress condition when a gate on the NFET is logic "high" and a source and a drain of the NFET are at a logic "low" voltage. Although, examples described herein illustrate how embodiments of the present invention overcomes adverse effects of threshold voltage ($V_T$) shifts in PFETs caused by NBTI, similar embodiments are contemplated to reduce threshold voltage ($V_T$) shifts in NFETs caused by PBTI.

Accordingly, there is a need for testing a memory device having field effect transistors subject to threshold voltage shifts caused by bias temperature instability.

SUMMARY OF THE INVENTION

According to one aspect of the present invention, a supply voltage is set for the memory device at a first supply voltage level. Test data is written to the memory device at the first supply voltage level in response to setting the supply voltage. The supply voltage is decreased for the memory device to a second supply voltage level below the first supply voltage level in response to writing the test data. The test data is read from the memory device at the second supply voltage level in response to decreasing the supply voltage. The supply voltage is increased for the memory device to a third supply voltage level above the second supply voltage level in response to reading the test data. The test data is read from the memory device at the third supply voltage level in response to increasing the supply voltage. The test data written to the memory device at the first supply voltage level is compared to the test data read from the memory device at the third supply voltage level in response to reading the test data from the memory device at the third supply voltage level.

According to other aspects of the present invention, the present invention employs a method, an apparatus, a system, the memory device, and/or a computer readable memory. The apparatus, the system, and/or the memory device may include data processing systems, which perform the method, and computer readable media storing executable applications which, when executed on the data processing systems, cause the data processing systems to perform the method.

These and other aspects of the present invention will be apparent from the accompanying drawings and from the following detailed description.

BRIEF DESCRIPTION OF THE DRAWINGS

Aspects of the present invention are illustrated by way of examples and not limitation in the figures of the accompanying drawings, in which like reference numbers designate corresponding elements.

DETAILED DESCRIPTION OF THE EMBODIMENTS

The following description and drawings are illustrative of the invention and are not to be construed as limiting the invention. Numerous specific details are described to provide a thorough understanding of the present invention. However, in certain instances, well-known or conventional details are not described in order to avoid obscuring the description of the present invention. References to one embodiment or an embodiment in the present disclosure are not necessarily to the same embodiment, and such references include one or more embodiments.

Figure 1:
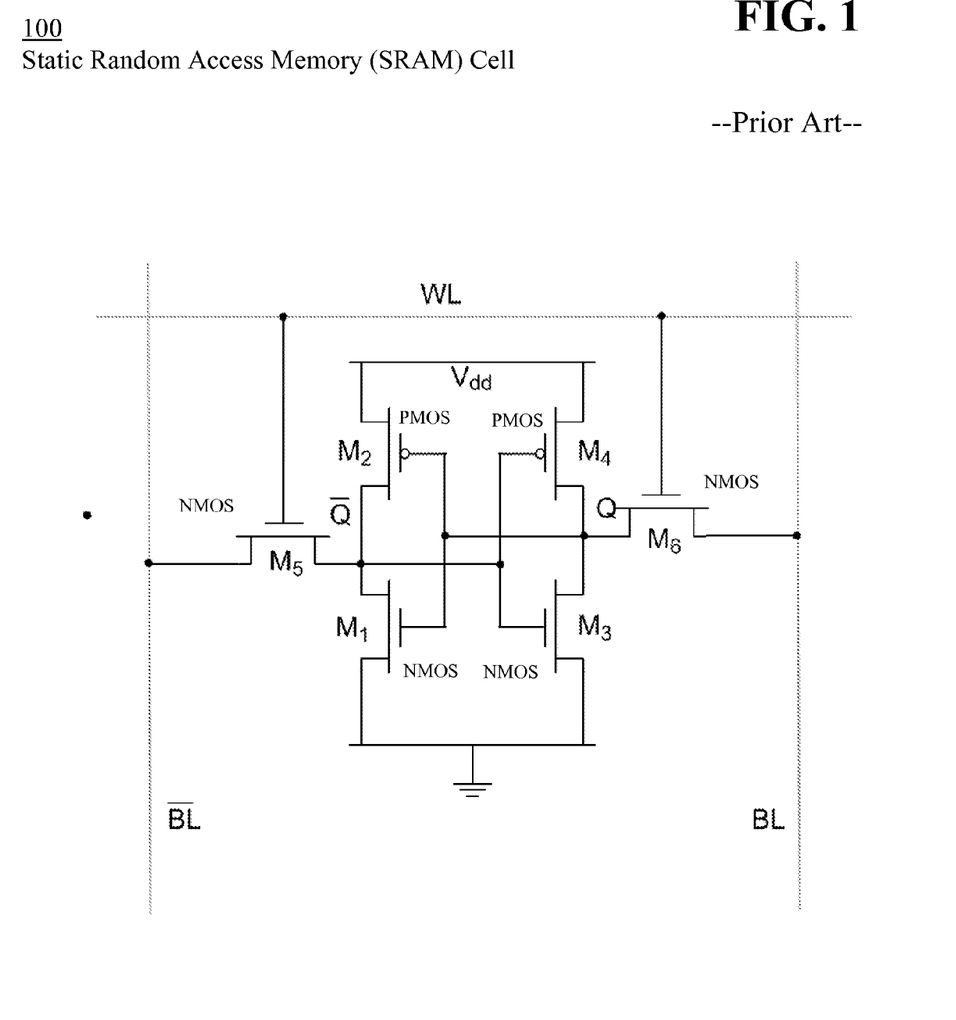
FIG. 1 illustrates static random access memory (SRAM) cell having field effect transistors subject to threshold voltage shifts caused by bias temperature instability, according to the prior art.

FIG. 1 illustrates static random access memory (SRAM) cell 100 having field effect transistors subject to threshold voltage shifts caused by bias temperature instability, according to the prior art. The SRAM cell includes six transistors and incorporates CMOS technology. The six transistors (M1-M6) typically include four n-channel metal-oxide-semiconductor field effect transistors (NMOSFET) (M1, M3, M5, M6) and two p-channel MOSFETs (PMOSFET) (M2 and M4). An SRAM cell typically uses a bistable latching circuit, as shown in FIG. 1, for example. The SRAM cell is bistable in that is has two stable states (e.g., logical 1 and 0) to store one bit of data. The latching circuit typically uses four transistors (M1-M4) implemented as two cross-coupled inverters to form a storage cell to store each bit of data. Two additional access transistors (M5 and M6) serve to control access to the storage cell during READ and WRITE operations. Therefore, a typical SRAM cell uses six transistors (M1-M6) to store each bit of data in memory.

Access to a cell is provided by a word line (WL) which controls the two access transistors M5 and M6 which, in turn, control whether the cell should be connected to the bit lines: BL and BL bar, which is an inverse of BL. The bit lines are used to transfer data for both READ and WRITE operations. While it's not strictly necessary to have two bit lines, a cell typically uses both the signal and its inverse to improve signal to noise margin.

An SRAM cell has three different modes including a STANDBY mode when the circuit is idle, a READ mode when data is requested from the circuit, and a WRITE mode when data is provided to the circuit.

In the STANDBY mode, if the word line (WL) is not asserted, the access transistors M5 and M6 isolate the cell (M1-M4) from the bit lines. The two cross coupled inverters, formed by transistors M1-M4, continue to reinforce each other and maintain their modes as long as they are isolated by the access transistors M5 and M6.

In the READ mode, assume that the content of the memory is a 1, stored at Q. The read cycle is started by precharging both the bit lines to a logical 1, then asserting the word line WL, enabling both the access transistors. The second step occurs when the values stored in Q and Q bar are transferred to the bit lines by leaving BL at its precharged value and discharging BL bar through M1 and M5 to a logical 0. On the BL side, the transistors M4 and M6 pull the bit line toward Vdd, a logical 1. If the content of the memory was a logical 0, the opposite would happen and BL bar would be pulled toward logical 1 and BL toward logical 0.

In the WRITE mode, the start of a WRITE cycle begins by applying the value to be written to the bit lines. To write a logical 0, a logical 0 would be applied to the bit lines, i.e. setting BL bar to logical 1 and BL to logical 0. A logical 1 is written by inverting the values of the bit lines. WL is then asserted and the value that is to be stored is latched in. The bit line input-drivers (M5 and M6) are designed to be stronger than the relatively weak transistors (M1-M4) in the cell itself, so that bit line input-drivers (M5 and M6) can easily override the previous mode of the cross-coupled inverters (M1-M4).

Figure 2:
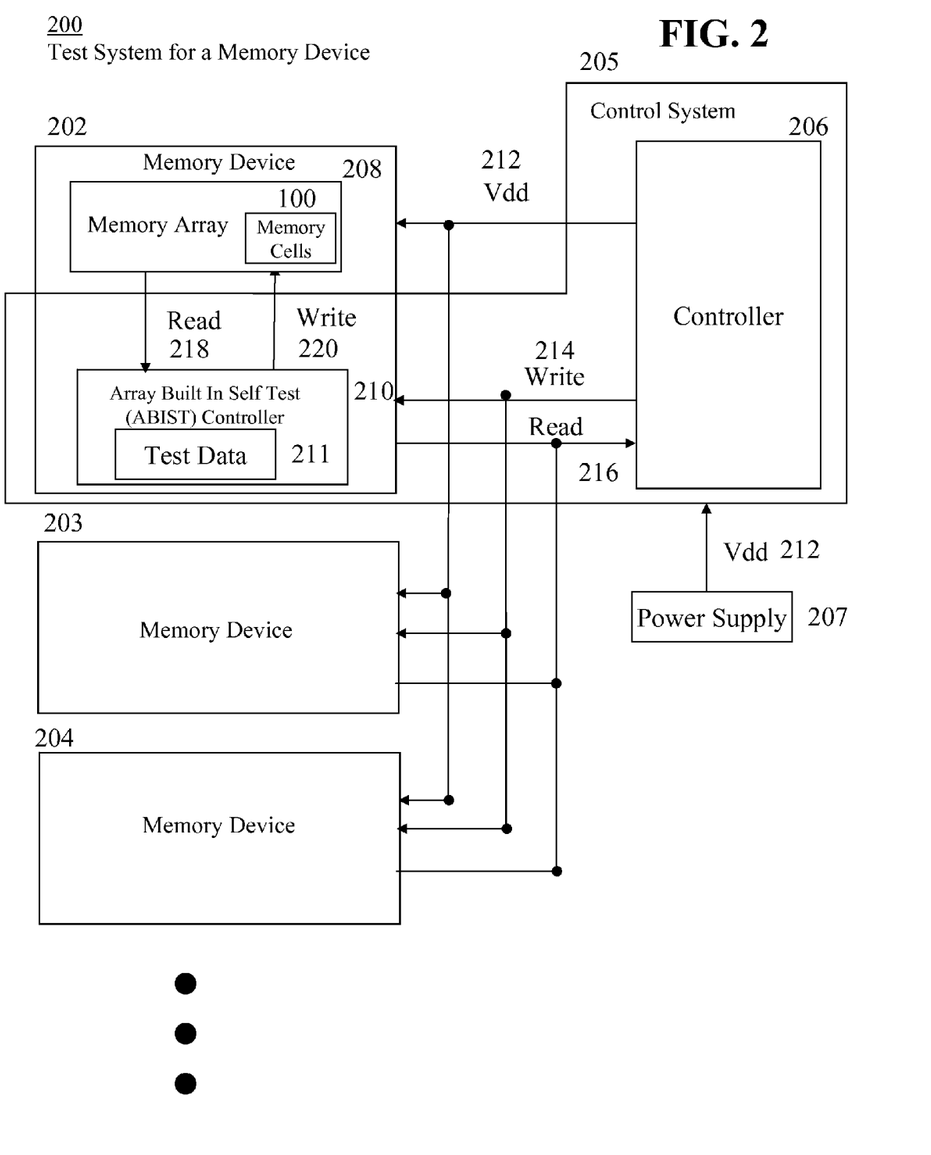
FIG. 2 illustrates a block diagram representation of a test system for a memory device incorporating memory cells, such as the memory cell shown in FIG. 1, and having field effect transistors subject to threshold voltage shifts caused by bias temperature instability, according to an example of the present invention.
Figure 3:
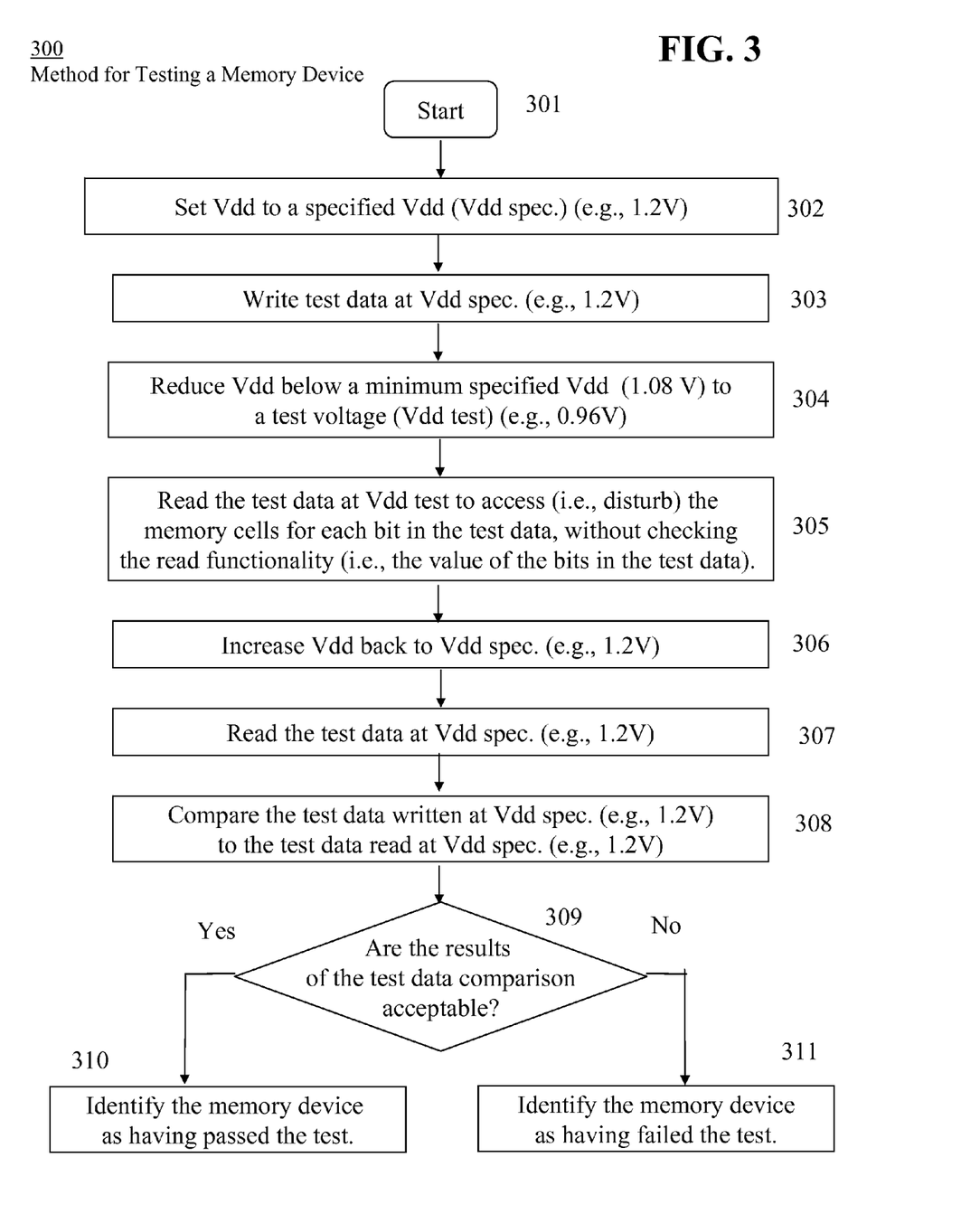
FIG. 3 illustrates a method for testing a memory device, shown in FIG. 2, having field effect transistors subject to threshold voltage shifts caused by bias temperature instability, according to an example of the present invention.

The present invention generally provides methods and apparatus for testing a memory device having field effect transistors subject to threshold voltage shifts caused by bias temperature instability (BTI) by employing a test system, shown in FIG. 2 and by employing a method 300, shown in FIG. 3. P-Channel FETS (PFETs) are particularly subject to threshold voltage shifts caused by negative bias temperature instability (NBTI) in present technology (e.g., 65 nm node). However, the present invention also contemplates threshold voltage shifts caused by positive bias temperature instability (PBTI) in N-Channel FETs (NFETs). Because the threshold voltage shifts caused by NBTI is a problem with PFETs in present technologies more so than threshold voltage shifts caused by PBTI is a problem with NFETs in present technologies, discussion and examples will focus on NBTI effects in PFETs. However, the threshold voltage shifts caused by PBTI in NFETs are contemplated. Such NBTI (PFETs) and PBTI (NFETs) are together designated BTI (bias temperature instability).

FIG. 2 illustrates a block diagram representation of a test system 200 for a memory device 202 incorporating memory cells, such as the memory cell 100 shown in FIG. 1, and having field effect transistors subject to threshold voltage shifts caused by bias temperature instability, according to an example of the present invention.

The test system 200 includes at least one memory device 202-204, a control system 205, and a power supply 207. The memory device 202 includes a memory array 208, which includes a plurality of memory cells 100, such as that shown in FIG. 1, for example. The control system 205 includes a controller 206 and/or an array built in self-test (ABIST) controller 210. FIG. 2 may include other elements not shown, such as bit line drivers, word line drivers, and sense amplifiers, which are well known in the art of memory devices. The memory device 202 may be any device readable by a processor and capable of storing data and/or a series of instructions embodying a process.

The memory device 202 may be employed in any electronic device or system, such as a communication device. A communication device permits wired or wireless communications including, without limitation, cellular, fixed wireless, PCS, or satellite communications. The communication device may operate in a communication system that provides for multiple access communications, in accordance with any standard or protocol, such as, for example, CDMA, TDMA, FDMA, or GSM, or combinations thereof. The communication device may be fixed (i.e., stationary) and/or mobile (i.e., portable). The communication device may be implemented in a variety of forms including, but not limited to, one or more of the following: a personal computer (PC), a desktop computer, a laptop computer, a workstation, a minicomputer, a mainframe, a supercomputer, a network-based device, a data processor, a personal digital assistant (PDA), a smart card, a cellular telephone, a camera, a pager, and a wristwatch.

The memory device 202 is generally referred to as a storage element, and may include in various embodiments: a simple latch, a register having a plurality of latches, a static random access memory (SRAM), and a dynamic random access memory (DRAM).

The control system 205 may be implemented in a variety of ways depending on various considerations, such as design, engineering, production, cost, size, number of inputs and outputs, etc. For example, the control system 205 may be implemented entirely within the memory device 202, such as, for example, the ABIST controller 210, without controller 206. Alternatively, the control system 205 may be implemented entirely outside the memory device 202, such as, for example, controller 206, without the ABIST controller 210. Alternatively, the control system 205 may be implemented partly inside the memory device 202, such as, for example, the ABIST controller 210, and partly outside the memory device 202, such as, for example, controller 206, as shown in FIG. 2.

The control system 205 executes the method 300 shown in FIG. 3. The alternative implementations of the control system 205 permits the steps 301 to 311 of the method 300 in FIG. 3 to be implemented in the ABIST controller 210, in the controller 206, or partly in the ABIST controller 210 and partly in the controller 206. Therefore, the various implementations of the control system 205 in combination with the various implementations of the steps in the method 300 permit a variety of alternative implementations to be employed for testing the memory device 202.

In the test system 200 having a shared or distributed control system, the controller 206 sends information to the memory device 202 over WRITE line 214 and receives information from the memory device 202 over the READ line 216. The memory device 202 receives from the controller 206 a supply voltage Vdd at line 212. In the memory device 202, the ABIST controller 210 sends information to the memory array 208 over WRITE line 220 and receives information from the memory array 208 over the READ line 218.

The test system 200 represents one example of a way to test one or more memory devices 202-204 in a foundry environment. The controller 206 works in cooperation with the ABIST controller 210 in the memory device 202 to test the memory device 202, according to the method 300 in FIG. 3. In this case, the controller 206 remains in the production facility (i.e., foundry or factory), and the memory device 202 is tested before being shipped to a customer. Alternatively, the test system 200 may be employed in any environment, including those outside the foundry environment, such as, for example, in any electronic device or system, such as the communication device.

Any number of memory devices 202-204 may be tested at one time, including a single memory device 202 or a plurality (i.e., group or batch) of memory devices 202-204. The test may be performed at one stage in the production line or at various stages in the production line. Further, the test may be performed at during one time duration or during different time durations.

The memory device 202 may be tested as a semiconductor die, either before or after protective packaging and external contacts are provided for the semiconductor die. Testing the semiconductor die, without packaging and external contacts, may lower the cost of material that does not pass the test, but may need to be performed in a clean room environment. Alternatively, testing the semiconductor die, with packaging and external contacts, may increase the cost of material that does not pass the test, but may not need to be performed in a clean room environment.

The communication lines 214 and 216 between the controller 206 and the ABIST controller 210 and the communication lines 218 and 220 between the ABIST controller 210 and the memory array 208 may have various alternative configurations. For example, the communication lines may employ single lines or multiple lines, dedicated lines or multiplexed lines, unidirectional lines or bi-directional lines, input lines or output lines, complimentary or non-complimentary outputs, inverted or non-inverted inputs, single or multiple clocks, the same or different protocols, and may carry various word lengths to be written or read. For example, SRAMs on a semiconductor chip typically have 32 or 64 data inputs, although SRAMs having more inputs or fewer inputs are also common.

Figure 4:
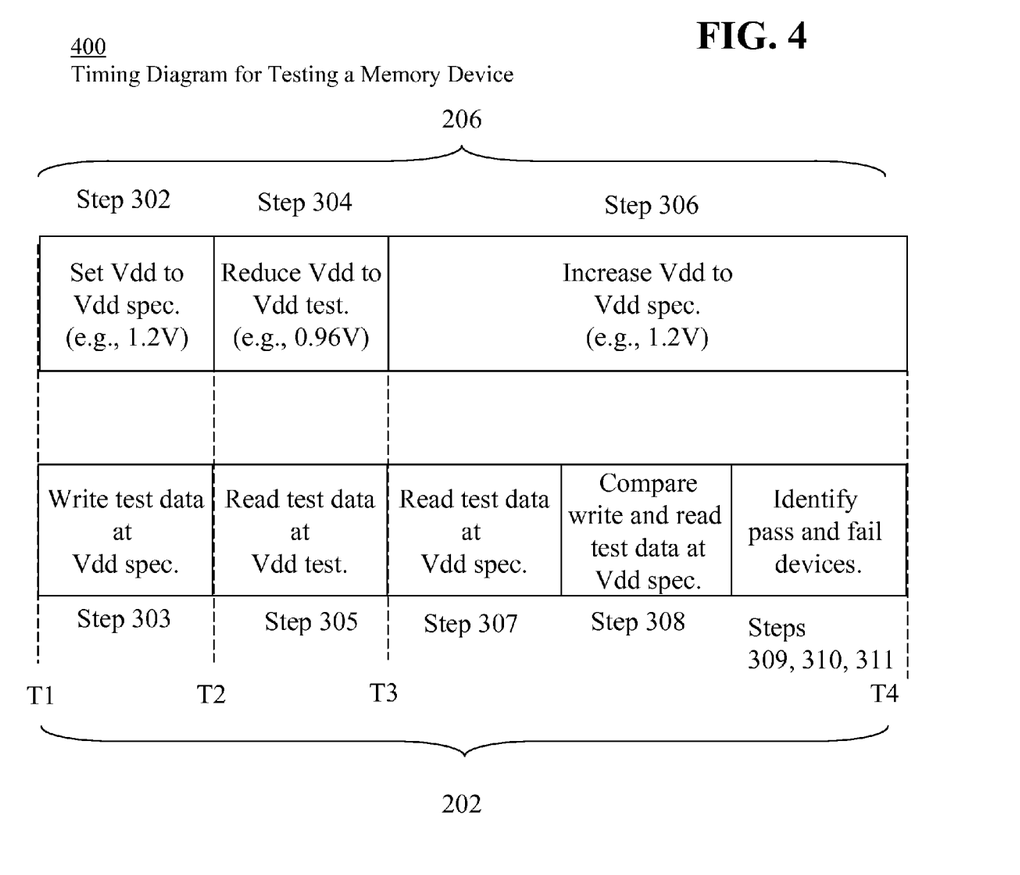
FIG. 4 illustrates timing diagram for testing a memory device, corresponding to the method shown in FIG. 3, according to an example of the present invention.

FIG. 3 illustrates a method 300 for testing a memory device 202, shown in FIG. 2, having field effect transistors subject to threshold voltage shifts caused by bias temperature instability, according to an example of the present invention. FIG. 4 illustrates timing diagram 400 for testing a memory device 202, corresponding to the method 300 shown in FIG. 3, according to an example of the present invention. FIGS. 3 and 4 are described together because each figure represents the same information (i.e., steps 302 to 311) in different formats (i.e., a flowchart 300 in FIG. 3 and a timing diagram 400 in FIG. 4) to describe an example of the present invention from different perspectives.

At step 301, the method 300 starts. Typically, the method 300 applies to memory devices 202 that have already been tested or verified to operate properly within specified design parameters.

At step 302, a supply voltage, Vdd, for the memory device 202 is set to a specified voltage (e.g., Vdd spec.). In a memory device manufactured with current CMOS fabrication designs, such as a 65 nm node, the specified voltage, Vdd spec., is typically 1.20 V nominal ±10%. The high end of the specified voltage is 1.20 V+10%=1.32 V. The low end of the specified voltage is 1.20 V−10%=1.08 V, which is the minimum specified voltage that is abbreviated as Vdd min. spec. The minimum specified voltage is the lowest voltage that the memory device is specified to operate at over a specified temperature range. Therefore, in one example, the supply voltage, Vdd, is set to a specified voltage, Vdd spec., between 1.08 V and 1.32 V, such as 1.20 V nominal. In FIG. 4, step 302 occurs at time, T1.

At step 303, test data is written to memory cells 100 in the memory device 202 at the specified voltage, Vdd spec. (e.g., 1.2V). The specified voltage, Vdd spec., in step 303 may be different from the specified voltage, Vdd spec., in step 302, but is typically the same for convenience. Typically, the specified voltage, Vdd spec., is written to the memory device 202 at a temperature of about 25 degrees Celsius (i.e. 77 degrees Fahrenheit), which might be considered room temperature. The test data may be any data pattern designed to test a memory device of a particular type and fabricated with a particular technology. The test data may be of any length or size, which could test one memory cell, multiple memory cells, or all of the memory cells of the memory device 202. Therefore, characteristics of the test data, such as its size and its data pattern, may affect the results of the test, such as accuracy and/or speed. In FIG. 4, step 303 occurs at time, T1 (plus a small time delay to permit Vdd in step 302 to stabilize).

At step 304, the supply voltage, Vdd, is reduced (i.e., scaled) below the minimum specified supply voltage, Vdd, (Vdd min. spec.) to a test supply voltage (Vdd test). In the example of 65 nm node fabrication technology, having a minimum specified supply voltage (Vdd min. spec.) equal to 1.08 V, the test voltage (Vdd test) may be 0.96 V, for example. In this case, the minimum specified supply voltage of 1.08 V is reduced 0.12 V (or 120 mV) to a test supply voltage of 0.96 V. In FIG. 4, step 304 occurs at time, T2 (plus a small time delay to permit data to be written in step 303).

The test supply voltage, Vdd test, may be determined in a variety of ways. In one example, the test supply voltage is determined empirically by experiment in a lab or engineering environment. In this case, the test supply voltage that is determined may be one or more test supply voltages, which is used to test all of the production memory devices. In one example, the test supply voltage is determined by running a stress test on sample memory devices. During the stress test, the sample memory devices are subject to an elevated temperature (e.g., 125 to 150 degree Celsius) and an elevated voltage (e.g., 1.5 to 1.6 times the nominal voltage (e.g., 1.2V), over extended time (e.g., 168 to 1000 hours). The memory device's minimum specified voltage, Vdd min. spec., is tested before and after the stress test to determine the amount of Vdd shift (e.g., 120 mV shift). For example, 1.08 Vdd min. spec. minus 120 mV of Vdd shift equals the test supply voltage, Vdd test, of 0.96 V. Typically, the stress test results in a distribution of supply voltage shifts among the sample memory devices (i.e., each memory device may have a different supply voltage shift). Although any particular voltage shift may be selected, one typically chooses a voltage shift that is 95% or higher in the distribution range of all supply voltage shifts to provide a thorough screening test of the production memory devices. Alternatively, a stress test may be run on memory devices having various test supply voltages, Vdd test, to see which memory devices pass the stress test (i.e., separate or bin the memory devices based on their performance.) Alternatively, in another example, the minimum test supply voltage may be determined by a feedback signal in a real time production environment. In this case, the test supply voltage, Vdd test, may vary among individual memory devices or groups (i.e., batches) of memory devices. Alternatively, a combination of the fixed and variable test supply voltages, Vdd test, may be used. In this case, the test supply voltage may vary in predetermined discrete voltage steps in response to a feedback signal among individual memory devices or groups (i.e., batches) of memory devices. The fixed test supply voltage(s) may be easier and/or faster to implement, but may be less adaptive than the variable minimum test supply voltage. The variable test supply voltage(s) may be more adaptive, but may be more complicated and/or time consuming to implement than the fixed test supply voltage. The combination of the fixed and variable test supply voltages may reduce the frequency of the feedback signal and to reduce the complexity of implementation.

An intended effect the applying the test supply voltage of 0.96 V to the memory device 202 is to create a screening or test condition on the memory cells 100 by having the memory cells function at a supply voltage less than the minimum specified supply voltage of 1.08 V. The test supply voltage applies a screening condition to the memory cells. This may be an attractive alternative to other known physical stress conditions, such as subjecting the memory cells to operation at high or low specified temperatures, operating at high voltage supply levels, and/or operating (e.g., writing and reading data) the memory cells over a period of time, which may be more difficult and/or time consuming to implement in a production environment. Of course, an applied test supply voltage, Vdd test, may be used in combination with known simulated physical stress conditions, such as those mentioned above, if so desired.

At step 305, the test data that was written to the memory cells 100 is read from the same memory cells 100 at the test supply voltage, Vdd test, (e.g., 0.96 V) to access each bit in the test data in the same memory cells 100. A READ function generally has two purposes including accessing memory cells and determining the bit value (i.e., logical 0 or 1) of the accessed memory cells. In step 305, the memory cells 100, having the written test data, are accessed, but the bit values of the accessed memory cells are not determined (e.g., only turn on the Word Line (WL) with the Bit Line (BL) in the READ mode in FIG. 1, without the memory device 202 acknowledging the bit values). Accessing the memory cells, without determining the bit values of the accessed memory cells, may otherwise be called READ disturbing the memory cells or a dummy READ of the memory cells. Since the memory device is not specified to operate at the minimum test supply voltage, determining the bit values of the accessed memory cells has limited value under the design-specified operating conditions, but may be performed if it is determined to have testing value. In FIG. 4, step 305 occurs at time, T2 (plus a small time delay to permit Vdd test to stabilize in step 304).

An intended effect accessing or disturbing the memory cells 100 in combination with applying the test supply voltage, Vdd test, of 0.96 V to the memory device 202 is to create a screening or test condition on the memory cells 100. These two conditions attempt to change (i.e., flip, shake out) the bit values (i.e., logical 1 to 0, or logical 0 to 1) of the memory cells 100 in which the test data was written. The memory cells in which the bit values change may be considered physically weak to maintain the bit values under such test conditions. The memory cells in which the bit values stay the same may be considered physically strong enough to maintain the bit values under such test conditions.

For a memory device 202 constructed as a SRAM, using, for example, an array of SRAM cells 100 shown in FIG. 1, a primary failure mode during traditional screening of the SRAM device occurs by accessing and determining bit values (i.e., a full READ function) of the cells 100 when the supply voltage is below the minimum specified supply voltage. The primary failure mode is typically caused by a sensing failure or by a sense amplifier, which does not have enough signal margin. The primary failure mode causes otherwise good parts to be discarded when the READ function of the SRAM is performed below the minimum specified supply voltage. To minimize unnecessary yield loss (i.e., maximize good parts) during the screening of the SRAM, the method 300 performs the dummy READ on the memory cells at a supply voltage (e.g., 0.96 V) below the minimum specified supply voltage (e.g., 1.08 V) to disturb the memory cells, without determining the bit values of the memory cells. The method 300 permits the memory cells that have less stability margin and that are vulnerable to BTI to be sorted out (i.e., screened out) as bad parts.

At step 306, the supply voltage Vdd is increased back to the specified supply voltage, Vdd spec., (e.g., 1.2V). This brings the memory device 202 back to a design-specified operating condition under which the memory device 202 is required to operate. The specified voltage, Vdd spec., in step 306 may be different from the specified voltage, Vdd spec., in steps 302 and 303, but is typically the same for convenience. In FIG. 4, step 306 occurs at time, T3 (plus a small time delay to permit test data to be read in step 305).

At step 307, the test data is read from the memory cells 100 at the specified voltage, Vdd spec., (e.g., 1.2V). In this step, both aspects of the READ function are performed including accessing memory cells and determining the bit value (i.e., logical 0 or 1) of the accessed memory cells. The specified voltage, Vdd spec., in step 307 may be different from the specified voltage, Vdd spec., in steps 302, 303, and 306, but is typically the same for convenience. In FIG. 4, step 307 occurs at time, T3 (plus a small time delay to permit Vdd spec. to stabilize in step 306).

At step 308, the test data written to the memory cells 100 at the specified supply voltage, Vdd spec., (e.g., 1.2V), before applying the screening conditions in steps 304 and 305, are compared to the test data read from the same memory cells 100 at the same or different specified supply voltage, Vdd spec. (e.g., 1.2V), after removing the screening conditions in steps 304 and 305.

The comparison may be performed by comparing each bit of test data that was written to the memory cells 100 to each bit of test data that was read from the same corresponding memory cells 100. Alternatively, various subsets of all of the bits (e.g., every other bit, or a string of bits) may be compared between corresponding memory cells, if so desired. Further, the comparison of the bits in the test data may be fixed (i.e., testing the same bits) or variable (e.g., adjusting the bits tested based on a feedback signal), if so desired.

At step 309, a determination is made as to whether the results of the comparison made in step 308 are acceptable (i.e., same, desirable, matched, ok, etc.). If the result of the comparison is determined to be acceptable, then the method 300 continues to step 310. If the result of the comparison is determined to be not acceptable, then the method 300 continues to step 311.

An interpretation of what is an acceptable comparison may vary. For example, an acceptable comparison may mean that each bit is the same. In this case, each bit that was written to a memory cell is the same as each bit that was read from the same corresponding memory cells (i.e., logical 1=logical 1, and logical 0=logical 0). In this case, the physical stress applied to the memory cells in steps 304 and 305 did not disturb (i.e., change or flip) the information stored (i.e., the bit values) in the memory cells. In another interpretation, having a determined percentage of bits, less than 100% of the bits, that did not change may be considered acceptable. In another interpretation, having determined locations of bits that did not change may be considered acceptable. These and/or other interpretations may be employed alone or in combination in step 309.

At step 310, the memory device 202 is identified as having passed the comparison test when the result of the comparison in step 309 is determined to be acceptable. A memory device 202 that has passed the comparison test is shipped to customers.

At step 311, the memory device 202 is identified as having failed the comparison test when the result of the comparison in step 309 is determined to be not acceptable. A memory device 202 that has failed the comparison test is not shipped to customers.

In steps 310 and 311, the identification of the memory device 202 as having passed or failed, respectively, may be a logic signal (e.g., logical 1 for pass, and logical 0 for fail). Alternatively, or in combination, the identification may be a communication with additional information, such as, for example, how many memory cells failed, the location of the memory cells, during which step of the method 300 the memory device 200 failed, etc.

A mathematical relationship between passed and failed memory devices 202 defines yield of the test results. The method 300 may improve the yield of the memory devices 202 by 20% to 30% over the traditional low voltage screening method, described above.

In FIG. 4, step 310 or step 311 ends at time T4, and the method 300 is permitted to repeat at step 302 for the different memory devices, or the same memory devices, if so desired. Running the method 300 one time for a memory device 202 should be faster than running the method 300 multiple times for the same memory device 202. However, consideration may be given to improve the yield of the tested memory devices 202. For example, running the method 300 more than once for the same memory device 202 using different test methodologies (e.g., data patterns, voltages, temperatures, test durations, different memory cells, etc., or combinations thereof) may improve yield, without adding significant time.

In FIG. 4, the controller 206 may perform steps 302, 304, and 306, and the ABIST controller 210 may perform steps 303, 305, and 307 to 311. Various other communications between the controller 206 and the ABIST controller 210 may be included in the method 300, which are not shown in FIG. 3, to improve communications, such as providing confirmation that communications and/or supply voltages were sent and/or received. For example, the controller 206 may send a command to the memory device 202 to enable the ABIST controller 210, and the ABIST controller 210 may send a command to the controller 206 that the ABIST controller 210 is enabled. In another example, the controller 206 may set the supply voltage Vdd at a particular voltage (e.g., steps 302, 304, and 306), and the memory device 202 may send a command to the controller 206 that the particular voltage is detected. In another example, the controller 206 may send a command to the ABIST controller 210 to perform the WRITE function at step 303, the READ disturb function at step 305, and the READ function at step 307, and the ABIST controller 210 may provide confirmation commands to the controller 206 that each command was received and/or completed. Likewise, similar commands may be exchanged between the controller 206 and the ABIST controller 210 for steps 308 to 311. In summary, any level of communications between the controller 206 and the ABIST controller 210 may be provided, exchanged, confirmed, etc. to support various considerations, such as testing speed, trouble shooting the test system 200, confidence and accuracy in the reliability of the testing, etc.

The system, elements, and/or processes contained herein may be implemented in hardware, software, or a combination of both, and may include one or more processors. A processor is a device and/or set of machine-readable instructions for performing task. A processor may be any device, capable of executing a series of instructions embodying a process, including but not limited to a computer, a microprocessor, a controller, an application specific integrated circuit (ASIC), finite state machine, digital signal processor (DSP), or some other mechanism. The processor includes any combination of hardware, firmware, and/or software. The processor acts upon stored and/or received information by computing, manipulating, analyzing, modifying, converting, or transmitting information for use by an executable application or procedure or an information device, and/or by routing the information to an output device.

An executable application comprises machine code or machine readable instruction for implementing predetermined functions including, for example, those of an operating system, a software application program, or other information processing system, for example, in response user command or input.

An executable procedure is a segment of code (i.e., machine readable instruction), sub-routine, or other distinct section of code or portion of an executable application for performing one or more particular processes, and may include performing operations on received input parameters (or in response to received input parameters) and providing resulting output parameters.

In various embodiments, hardwired circuitry may be used in combination with software instructions to implement the present invention. Thus, the techniques are not limited to any specific combination of hardware circuitry and software, or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor.

It will be apparent from this description that aspects of the present invention may be embodied, at least in part, in software. That is, the techniques may be carried out in a computer system or other data processing system in response to its processor executing sequences of instructions contained in a machine-readable medium.

A machine-readable medium includes any mechanism that provides (i.e., stores and/or transmits) information in a form accessible by a machine (e.g., a computer, network device, personal digital assistant, computer, data processor, manufacturing tool, any device with a set of one or more processors, etc.). A machine-readable medium can be used to store software and data which, when executed by a data processing system, causes the system to perform various methods of the present invention. Portions of this executable software and/or data may be stored in various places.

For example, a machine-readable medium includes recordable/non-recordable media (e.g., read only memory (ROM), random access memory (RAM), magnetic disk storage media, optical storage media, flash memory devices, non-volatile memory, cache, remote storage device, etc.), as well as electrical, optical, acoustical or other forms of propagated signals (e.g., carrier waves, infrared signals, digital signals, etc.), etc.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for testing a memory device comprising:
    setting a supply voltage for the memory device at a first supply voltage level;
    writing test data to the memory device at the first supply voltage level in response to setting the supply voltage;
    decreasing the supply voltage for the memory device to a second supply voltage level below the first supply voltage level in response to writing the test data;
    accessing the test data from the memory device at the second supply voltage level, without identifying the test data, in response to decreasing the supply voltage;
    increasing the supply voltage for the memory device to a third supply voltage level above the second supply voltage level in response to reading the test data;
    reading the test data from the memory device at the third supply voltage level in response to increasing the supply voltage; and
    comparing the test data written to the memory device at the first supply voltage level to the test data read from the memory device at the third supply voltage level in response to reading the test data from the memory device at the third supply voltage level.

2. A method, according to claim 1, wherein the first supply voltage level is a specified voltage level for operating the memory device.

3. A method, according to claim 1, wherein the third supply voltage level is a specified voltage level for operating the memory device.

4. A method, according to claim 1, wherein each of the first supply voltage level and the third supply voltage level is a specified voltage level for operating the memory device.

5. A method, according to claim 1, wherein the second supply voltage level is below a minimum specified voltage level for operating the memory device.

6. A method, according to claim 1, comprising:
    determining whether the memory device is acceptable or not acceptable in response to comparing the test data.

7. A method, according to claim 6, comprising:
    identifying the memory device as being acceptable when comparing the test data produces a favorable result; and
    identifying the memory device as not being acceptable when comparing the test data produces an unfavorable result.

8. A method, according to claim 1, wherein the memory device is a Static Random Access Memory (SRAM) device.

9. A method for testing a memory device comprising:
    setting a supply voltage for the memory device at a specified supply voltage;
    writing test data to the memory device at the specified supply voltage in response to setting the supply voltage;
    decreasing the supply voltage for the memory device to a voltage level below a minimum specified supply voltage in response to writing the test data;
    accessing the test data from the memory device at the voltage level below the minimum specified supply voltage, without identifying the test data, in response to decreasing the supply voltage;
    increasing the supply voltage for the memory device back to the specified supply voltage in response to reading the test data;
    reading the test data from the memory device at the specified supply voltage in response to increasing the supply voltage; and
    comparing the test data written to the memory device at the specified supply voltage to the test data read from the memory device at the specified supply voltage in response to reading the test data from the memory device at the minimum specified supply voltage.

10. A method, according to claim 9, comprising:
    determining whether the memory device is acceptable or not acceptable in response to comparing the test data.

11. A method, according to claim 10, comprising:
    identifying the memory device as being acceptable when comparing the test data produces a favorable result; and
    identifying the memory device as not being acceptable when comparing the test data produces an unfavorable result.

12. A method, according to claim 9, wherein the memory device is a Static Random Access Memory (SRAM) device.

13. An apparatus for testing a memory device, comprising:
    a control system adapted for performing the following activities:
        setting a supply voltage for the memory device at a first supply voltage level;
        writing test data to the memory device at the first supply voltage level in response to setting the supply voltage;
        decreasing the supply voltage for the memory device to a second supply voltage level below the first supply voltage level in response to writing the test data;
        accessing the test data from the memory device at the second supply voltage level, without identifying the test data, in response to decreasing the supply voltage;
        increasing the supply voltage for the memory device to a third supply voltage level above the second supply voltage level in response to reading the test data;
        reading the test data from the memory device at the third supply voltage level in response to increasing the supply voltage; and
        comparing the test data written to the memory device at the first supply voltage level to the test data read from the memory device at the third supply voltage level in response to reading the test data from the memory device at the third supply voltage level.

14. An apparatus, according to claim 13, wherein the control system comprises:
    a controller that is separate from the memory device and that is located outside of the memory device.

15. An apparatus, according to claim 13, wherein the control system comprises:
    an array built in self-test controller that is integral to the memory device and that is located inside the memory device.

16. An apparatus, according to claim 13, wherein the control system comprises:
    a controller that is separate from the memory device and that is located outside of the memory device; and
    an array built in self-test (ABIST) controller that is integral to the memory device and that is located inside the memory device,
    wherein some activities of the control system are performed by the controller and other activities of the control system are performed by the ABIST controller.

17. A memory device comprising:
an array of memory cells adapted to store data that are written to memory cells and to provide data that are read from the memory cells, wherein the following activities are performed on the memory cells:
  setting a supply voltage for the memory cells at a first supply voltage level;
  writing test data to the memory cells at the first supply voltage level in response to setting the supply voltage;
  decreasing the supply voltage for the memory cells to a second supply voltage level below the first supply voltage level in response to writing the test data;
  accessing the test data from the memory cells at the second supply voltage level, without identifying the test data, in response to decreasing the supply voltage;
  increasing the supply voltage for the memory cells to a third supply voltage level above the second supply voltage level in response to reading the test data;
  reading the test data from the memory cells at the third supply voltage level in response to increasing the supply voltage; and
  comparing the test data written to the memory cells at the first supply voltage level to the test data read from the memory cells at the third supply voltage level in response to reading the test data from the memory cells at the third supply voltage level.

18. A memory device, according to claim 17, comprising:
an array built in self-test controller, integral to the memory device and located inside the memory device, adapted to perform one or more of the activities.

19. A memory device, according to claim 17, wherein the memory device is a Static Random Access Memory (SRAM) device.

20. A system for testing a memory device comprising:
a source of a supply voltage adapted for providing a supply voltage to the memory device; and
a control system adapted for:
  setting a supply voltage for the memory device at a first supply voltage level;
  writing test data to the memory device at the first supply voltage level in response to setting the supply voltage;
  decreasing the supply voltage for the memory device to a second supply voltage level below the first supply voltage level in response to writing the test data;
  accessing the test data from the memory device at the second supply voltage level, without identifying the test data, in response to decreasing the supply voltage;
  increasing the supply voltage for the memory device to a third supply voltage level above the second supply voltage level in response to reading the test data;
  reading the test data from the memory device at the third supply voltage level in response to increasing the supply voltage; and
  comparing the test data written to the memory device at the first supply voltage level to the test data read from the memory device at the third supply voltage level in response to reading the test data from the memory device at the third supply voltage level.

21. A system, according to claim 20, wherein the control system comprises:
a controller that is separate from the memory device and that is located outside of the memory device.

22. A system, according to claim 20, wherein the control system comprises:
an array built in self-test controller that is integral to the memory device and that is located inside the memory device.

23. A system, according to claim 20, wherein the control system comprises:
a controller that is separate from the memory device and that is located outside of the memory device; and
an array built in self-test (ABIST) controller that is integral to the memory device and that is located inside the memory device,
wherein some activities of the control system are performed by the controller and other activities of the control system are performed by the ABIST controller.

* * * * *